(12) United States Patent
Co et al.

(10) Patent No.: US 6,774,662 B2
(45) Date of Patent: *Aug. 10, 2004

(54) IN-LINE D.C. TESTING OF MULTIPLE MEMORY MODULES IN A PANEL BEFORE PANEL SEPARATION

(75) Inventors: Ramon S. Co, Trabuco Canyon, CA (US); Tat Leung Lai, Torrance, CA (US)

(73) Assignee: Kingston Technology Co., Fountain Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/707,639

(22) Filed: Dec. 29, 2003

(65) Prior Publication Data

US 2004/0113607 A1 Jun. 17, 2004

Related U.S. Application Data

(62) Division of application No. 09/724,267, filed on Nov. 28, 2000, now Pat. No. 6,700,398.

(51) Int. Cl.[7] .............................................. G01R 31/02
(52) U.S. Cl. .................. 324/765; 324/771; 324/158.1
(58) Field of Search .................................. 324/771, 765, 324/158.1, 769, 760; 714/736, 32

(56) References Cited

U.S. PATENT DOCUMENTS

5,012,187 A * 4/1991 Littlebury .................... 324/754
6,559,673 B2 * 5/2003 Neeb .......................... 324/771

* cited by examiner

*Primary Examiner*—David A. Zarneke
*Assistant Examiner*—Trung Q. Nguyen
(74) *Attorney, Agent, or Firm*—Stuart T. Auvinen

(57) ABSTRACT

A production test machine pre-screens panels of memory modules for shorts and leakage and other D.C. parameters. Memory modules are constructed as part of a panel of 6 or so modules formed on the same substrate. The modules are connected together by links of the substrate. The D.C. tests are performed on memory modules before separation from the panel (de-panelization), while the modules are still connected together by the panel links. Using parallel testing, a whole panel of modules can be D.C. tested at the same time. Failing modules can then be marked or noted, and the good modules separated from the panel links and sent to a more expensive A.C. tester for functional testing. The spacing or pitch of test heads on the D.C. tester can be adjusted for different sizes of panels.

12 Claims, 8 Drawing Sheets

US 6,774,662 B2

IN-LINE D.C. TESTING OF MULTIPLE MEMORY MODULES IN A PANEL BEFORE PANEL SEPARATION

CROSS REFERENCE TO RELATED APPLICATIONS

This application is a divisional of U.S. Ser. No. 09/724,267, filed Nov. 28, 2000, now U.S. Pat. No. 6,700,398.

BACKGROUND OF INVENTION

This invention relates to test systems, and more particularly to production-line D.C. testing of memory modules.

Memory is a basic part of many kinds of electronic systems. A common, low-cost memory is dynamic-random-access memory (DRAM). Rather than sell individual DRAM chips, such chips are often pre-assembled into modules that can be inserted into sockets in a wide variety of systems. Such memory modules have gained enormous popularity in recent years. Most personal computers (PC's) are shipped with sockets for memory modules so the PC user can later add additional modules, increasing the memory capacity of the PC. High-volume production and competition have driven module costs down dramatically, benefiting the PC buyer.

Memory modules are made in many different sizes and capacities, such as older 30-pin modules and newer 72-pin and 168-pin modules. The "pins" were originally pins extending from the module's edge, but now most modules are leadless, having metal contact pads or leads. The modules are small in size, being about 3–5 inches long and about an inch to an inch and a half in height.

The modules contain a small printed-circuit board substrate, typically a multi-layer board with alternating laminated layers of fiberglass insulation and foil or metal interconnect layers. Surface mounted components such as DRAM chips and capacitors are soldered onto one or both surfaces of the substrate. Memory modules are often manufactured in large automated machines using surface-mount-technology (SMT). These machines are like small assembly lines, producing finished but untested memory modules. The memory modules are then tested before shipment.

The highly-competitive, high-volume nature of the memory-module-manufacturing business dictates that costs be driven as low as possible. Testing costs are significant. Methods to reduce test cost or complexity are desirable.

DETAILED DESCRIPTION

The present invention relates to an improvement in memory-module testing. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
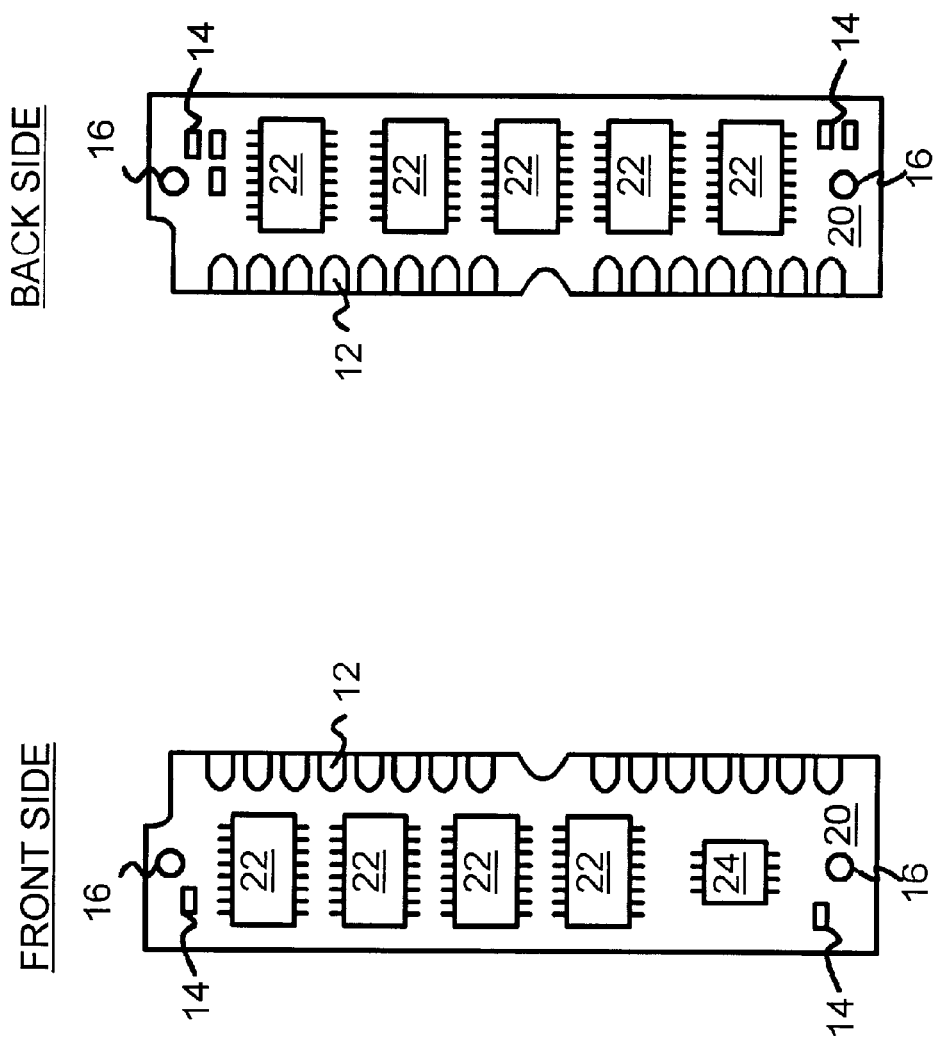
FIGS. 1A–B show a double-sided memory module.

FIGS. 1A–B show a double-sided memory module. The memory module 20 contains a substrate such as a multilayer printed-circuit board (PCB) with surface-mounted DRAM chips 22 mounted to the front surface or side of the substrate, as shown in FIG. 1A, while more DRAM chips 22 are mounted to the back side or surface of the substrate as shown in FIG. 1B. Metal contact pads 12 are positioned along the bottom edge of the module on both front and back surfaces. Metal contact pads 12 mate with pads on a module socket to electrically connect the module to a PC's motherboard. Holes 16 are present on some kinds of modules to ensure that the module is correctly positioned in the socket. Capacitors 14 or other discrete components are surface-mounted on the substrate to filter noise from the DRAM chips 22.

Flash memory 24 is an electrically-erasable programmable read-only memory that can be programmed by the manufacturer. Configuration information about the memory is often written to flash memory 24. Such configuration information may include the memory depth and width, locations of bad memory cells, speed of the memory, the type of memory, a manufacturing week code, critical timing parameters such as CAS (column address select) latency, and any proprietary information. Flash memory 24 is known in one embodiment as a serial-presence detect (SPD) memory. During boot-up, the PC checks for "serial presence" on its memory bus. If a serial presence is detected, the PC reads the stored memory configuration through the serial line. Once programmed, flash memory 24 can be read by a PC on boot-up to determine the kind of memory installed in the PC.

Figure 2:
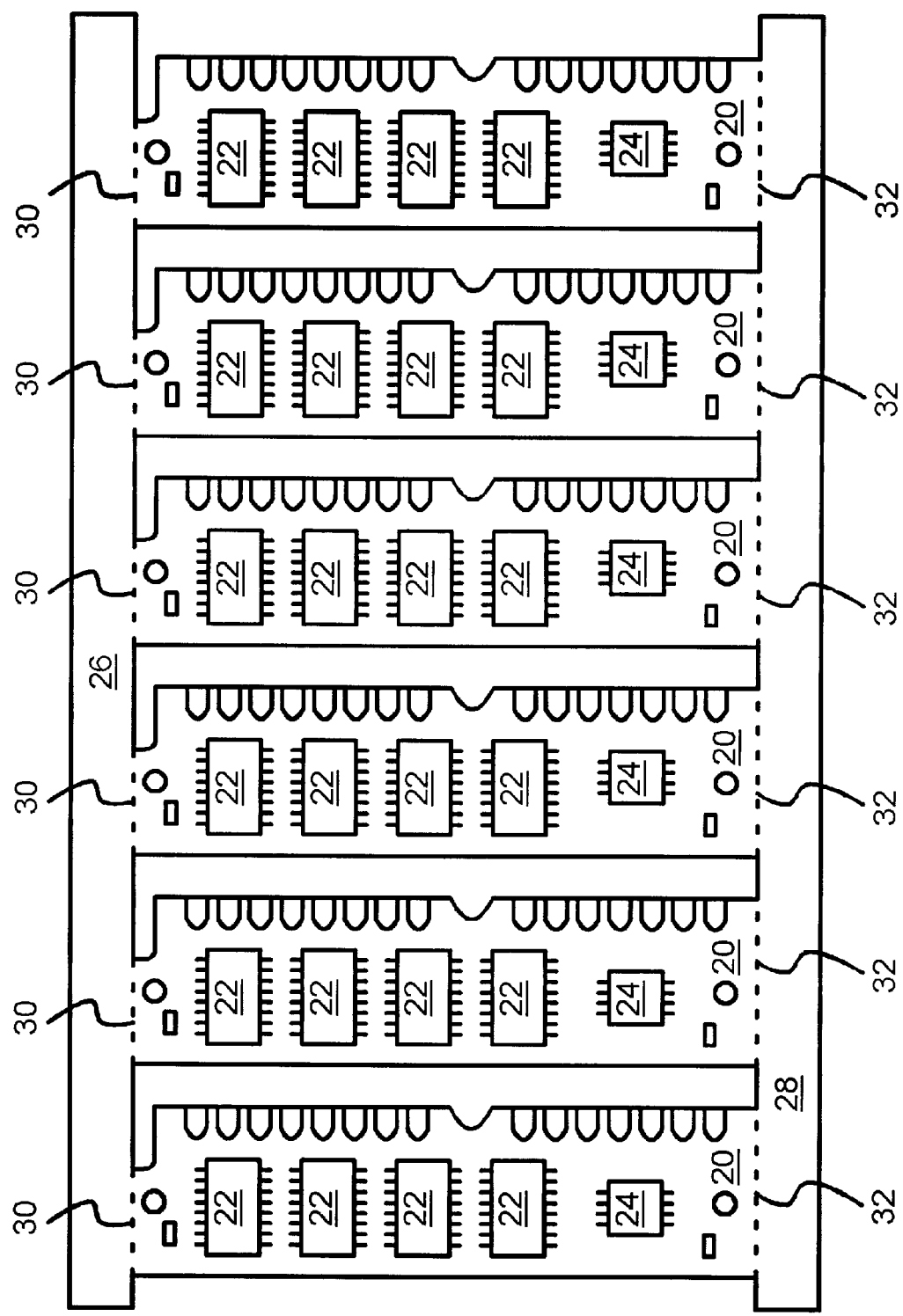
FIG. 2 shows a panel of six memory modules.

Panels of Memory Modules—FIG. 2

FIG. 2 shows a panel of six memory modules. Due to the small size of memory modules, some manufacturers and SMT machines make several memory modules at the same time. The modules are formed on the same substrate. The modules are later separated and tested. Often six memory modules are formed or manufactured together on a substrate known as a panel. Some panels may have different numbers of memory modules, such as 4, 5, 7, or 8, depending on the physical dimension of the memory module.

The panel shown in FIG. 2 has six memory modules 20 that are formed together on the same PCB substrate. Links 26, 28 are parts of the substrate that function to hold the modules together during manufacture, but are not part of the memory modules 20.

During manufacture, a blank PCB substrate containing links 26, 28 and modules 20 is fed into an SMT machine. The SMT machine applies solder paste, attaches DRAM chips 22, flash memory 24, and capacitors or other discrete components to the solder paste, and then heats the solder paste to reflow the solder, soldering DRAM chips 22, flash memory 24, and capacitors to metal traces on the PCB substrate. The reverse side of modules 20 is made in a similar fashion.

Once manufacturing by the SMT machine is complete, the modules 20 are separated from links 26, 28. A clamping machine can clamp down onto link 26, bending it or modules 20 up and down until scribe lines 30 are broken, separating modules 20 from link 26. Then the clamping machine can clamp down on link 28, again bending it or modules 20 until the substrate breaks apart at scribe lines 32, separating modules 20 from link 28. Scribe lines 30, 32 could also be separated by sawing, or by scribing with a sharp instrument before separation. The PCB substrate can be made with a scribe or other indentation at scribe lines 30, 32 to facilitate separation, although this is not required.

Although modules 20 could be connected directly to each other, they are generally not as breaking a longer link would be needed. Using links 26, 28, only the smaller scribe lines 30, 32 need to be broken to separate the modules that are separated by an opening from each other. Links 26, 28 provide mechanical stability for modules 20 in the SMT machine, allowing more precise component placement. Other linking schemes are possible.

Once links 26, 28 are removed, the six modules 20 are each tested. The modules 20 may be placed onto a tray for automated handling, and can be tested by high-speed testers that are commercially available. However, these commercial testers, although able to generate high-speed test vectors, are expensive. Test cost is proportional to the amount of time that a module spends on such a tester.

Test Cost

Manufacturing defects may cause some modules 20 to fail on the tester. Some of these failures may be caused by minor defects, such as when a single memory cell in a large memory chip is defective, or when a single metal trace on the substrate is broken. These failures can be detected when lengthy test vectors are applied to the module by the commercial tester.

Other failures are more severe, such as when a power-to-ground short occurs on the module, or metal traces are shorted together. These failures can also be found by the commercial tester. However, it is better to find these failures on a less expensive tester, allowing the more expensive commercial tester to be used for verifying good modules or finding minor defects. The overall test cost is reduced when some failures, such as the shorts, are found on a less expensive tester.

The high-speed testers are known as dynamic or A.C. testers, since high-speed signals are applied to the module. The high frequency of the signals requires special care in design of the A.C. tester to minimize signal distortion.

Low-speed tests, such as testing for shorts and voltage levels, are known as D.C. tests, since slow or even static signals are applied for these tests. These D.C. tests can be performed on the high-speed A.C. testers before the high-speed tests are performed. Such initial D.C. tests are useful not only for screening gross failures, but also to protect the tester from damage due to shorts on the device-under test.

D.C. Pre-Tester can Reduce Test Costs

Even though initial D.C. tests may be needed for all modules on an A.C. tester to prevent tester damage, test costs can still be reduced by performing a separate screen for gross failures. A simple D.C. tester can be used to screen all modules to find the grossly-failing modules such as shorted modules. The grossly-failing modules are found by the D.C. tester before A.C. testing and are not loaded onto the A.C. tester. Test costs can be reduced, since the A.C. tester does not waste time testing the grossly-failing modules. To significantly reduce costs, the D.C. tester should be inexpensive.

In some test systems, the D.C. tester may ensure that no grossly-failing modules reach the A.C. tester. Then the A.C. tester can be programmed to skip the initial D.C. tests altogether. Some test systems, such as "Testing Memory Modules with a PC Motherboard Attached to a Memory-Module Handler by a Solder-Side Adaptor Board" described in U.S. Pat. No. 6,178,526, Ser. No. 09/056,973, filed Apr. 8, 1998, by Nguyen et al., and assigned to Kingston Technology, can benefit by such D.C. tester pre-screening.

Since the A.C. testers accept the memory modules after separation from the panels, any D.C. tests using the A.C. tester are performed after panel separation (called de-panelization). Simple D.C. testers likewise can operate on separated memory modules after de-panelization.

D.C. Tester Before De-Panelization—FIG. 3

Figure 3:
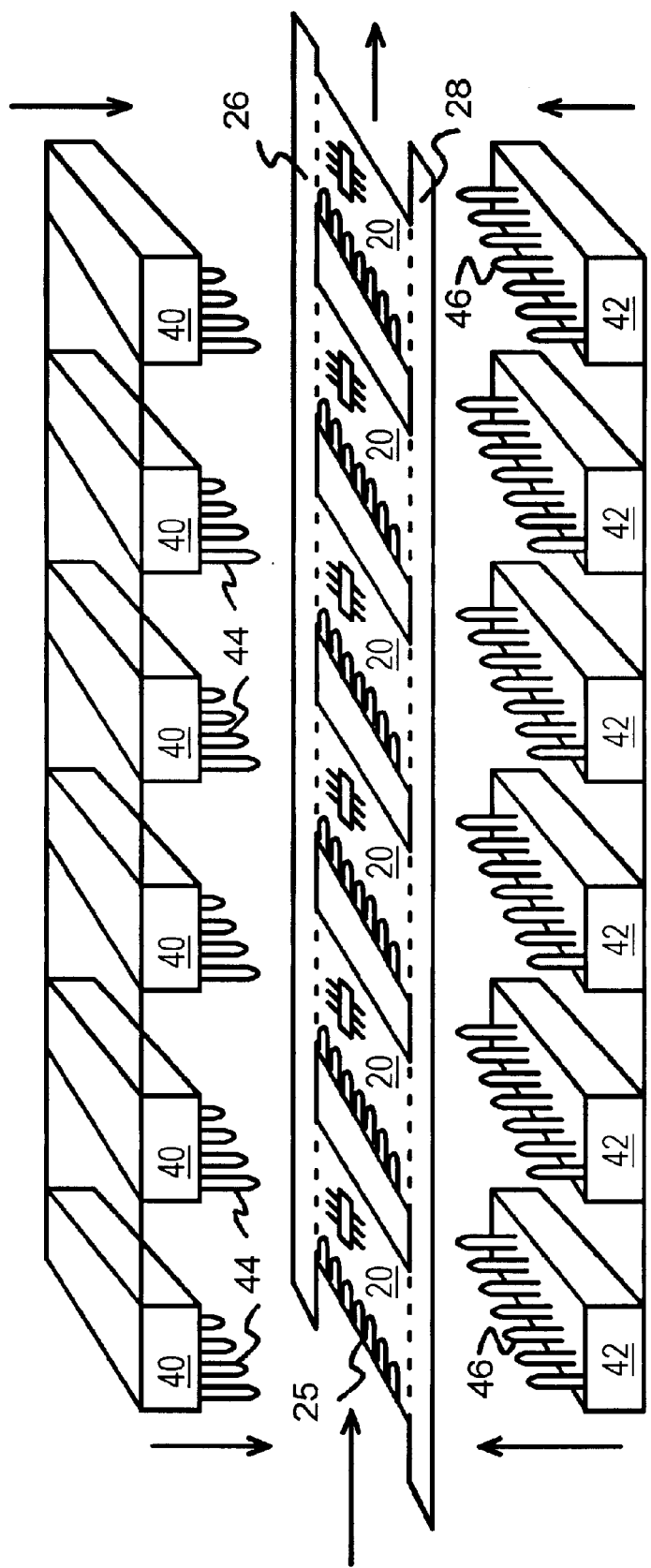
FIG. 3 shows a D.C. tester that tests a panel of memory modules before de-panelization.

FIG. 3 shows a D.C. tester that tests a panel of memory modules before de-panelization. Costs can be reduced and testing simplified by performing D.C. tests on memory modules before de-panelization, while the modules are still connected together by the panel links. When full parallel testing is performed, a whole panel can be D.C. tested at the same time. Failing modules can then be marked or noted, and the good modules separated from the panel links and sent to the A.C. tester.

Panel 25 containing memory modules 20 is moved under test heads 40, which have test pins 44. Test heads 40 are lowered relative to panel 25 until test pins 44 make electrical contact with the metal contact pads on memory module 20. Test pins 44 can be spring-mounted or pogo pins so that very little force is exerted when contact is made, minimizing mechanical stress and scratching or damage to the pads. Alternately, small bumps can be used for pins 44, or other kinds of test probes can be substituted.

When memory modules 20 are double-sided, lower test heads 42 are also employed. Test pins 46 on lower test heads 42 make contact with metal pads on the bottom of memory modules 20 when lower test heads 42 are raised relative to panel 25. Once both sets of pins 44, 46 make contact with the pads on memory modules 20, the D.C. test can be performed by applying stimulus voltages to pads that are inputs and measuring pad voltages and/or currents.

Panel 25 has links 26, 28 that hold six memory modules 20 together in a panel. In one embodiment, panel 25 is the same panel that was processed by the SMT machine that inserts the memory chips onto the substrate of panel 25, but in other embodiments the SMT and D.C. tester panel sizes could differ. Panel 25 could be automatically removed from the SMT assembly machine and placed on a conveyer belt or other robotic movement system to be moved into position in the D.C. tester between test heads 40, 42.

For parallel testing, all six test heads 40 are held together and lowered to make contact with all six modules 20 of panel 25 at the same time. Likewise, all size lower test heads 42 are held together and raised to make contact with all six modules 20 when test heads 40 contact modules 20. Test heads 40 can be held together in a variety of ways, such as by being held by metal rods or bars or by being part of a larger assembly.

Figure 4:
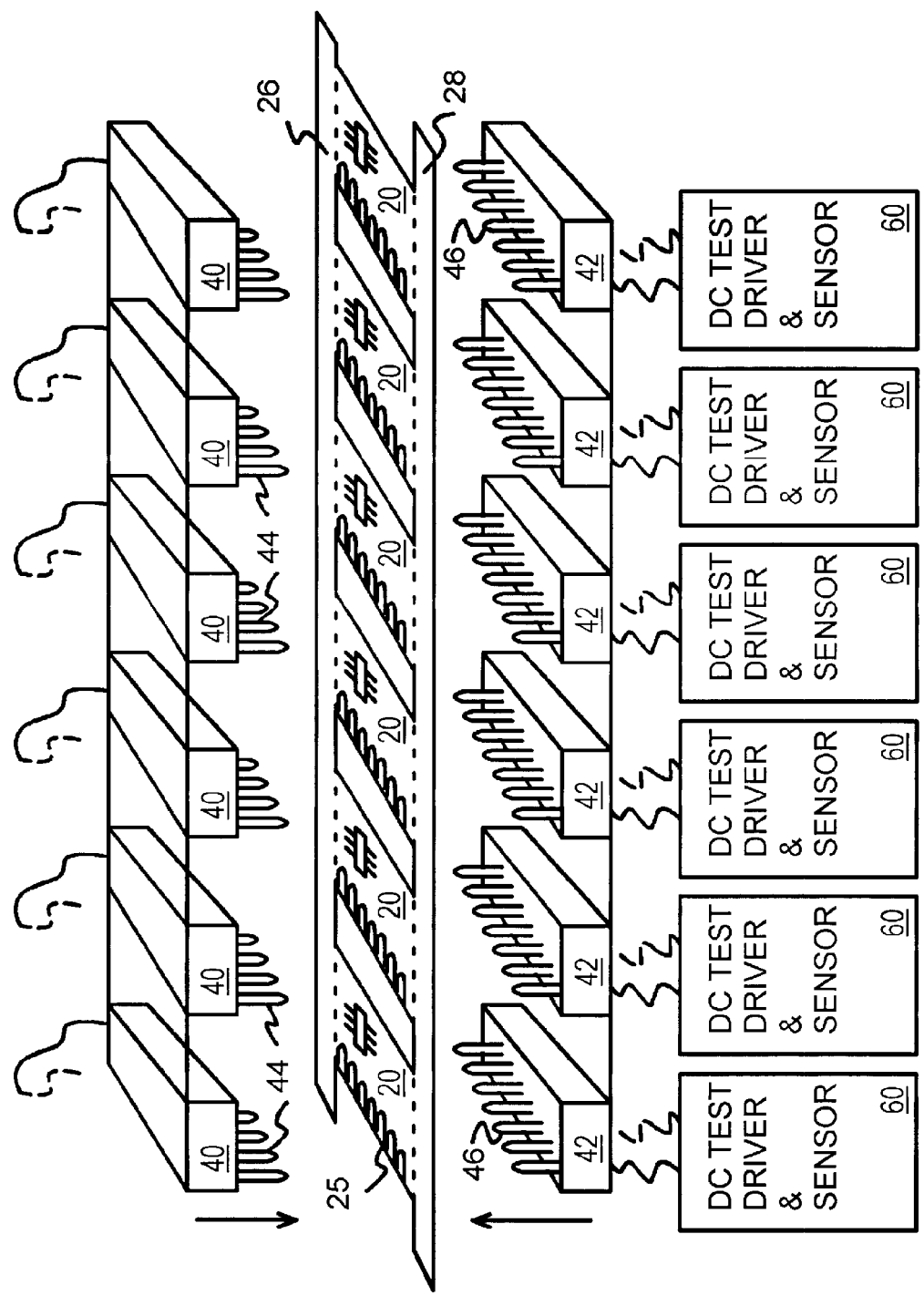
FIG. 4 shows parallel test drivers connected to test heads that perform D.C. testing on a whole panel of memory modules before de-panelization.

Parallel Testing—FIG. 4

FIG. 4 shows parallel test drivers connected to test heads that perform D.C. testing on a whole panel of memory modules before de-panelization. Once panel 25 has been moved into position between test heads 40, 42, test heads 40 are lowered so that pins 44 make contact with the pads on the top surface of memory modules 20, while test heads 42 are raised so that pins 46 also make contact with pads on the bottom surface of memory modules 20.

Once contact has been made with all memory modules 20 on panel 25, test drivers 60 are activated or coupled to test heads 40, 42. All pins can be connected to ground by test drives 60, and the power-supply pin's voltage raised to a power-supply voltage and its current measured for leakage. Other input pins can also be tested for leakage current by raising their voltages and measuring the current drawn by the pins. D.C. voltage levels of output pins can then be measured by sensing logic in test driver 60. A sequence of test vectors may need to be applied to inputs before certain D.C. output levels are reached, such as when an output is driven by sequential logic or memory cells rather than direct combinatorial logic from inputs.

Once the tests are completed on panel 25, test drivers 60 are de-activated or disconnected from pins 44, 46 to prevent damage. Test heads 40 are raised and lower test heads 42 are lowered to release test pins 44, 46. Panel 25 can then be moved out from under test heads 40 and another panel moved into position under test heads 40 for testing. For example, a conveyer could move panels from left to right, or a robotic arm could move panels in and out of position from the left, right, or front or back.

Test drivers 60 can be separate test sequencers and sensors as shown, or they may be part of a larger test system. Separate sensors could be provided for each module 20, while common stimuli are applied to all modules 20 in panel 25, perhaps with some separate buffering to each module. Test drivers 60 can be controlled by a host system, such as one that controls movement of test heads 40, 42 and a panel conveyer or robotic arm.

The conveyer can handle the panels by the panel links. Damage from handling to the module regions of the substrate is then avoided, since the metal traces and memory chips are not handled. Likewise, a robotic arm can grip the panel by the links rather than by the module regions, and a gravity-fed handler can slide the panels along guides that fit the links.

Figure 5:
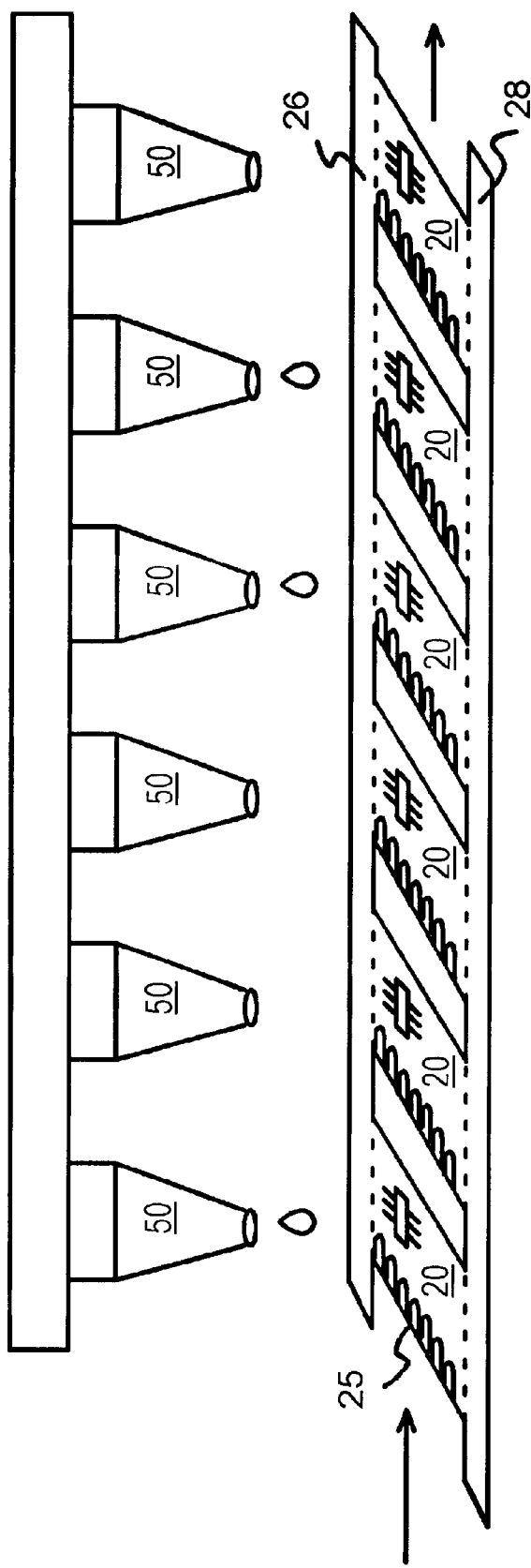
FIG. 5 shows an inker for marking bad modules in a panel that was tested by the D.C. panel tester.

FIG. 5 shows an inker for marking bad modules in a panel that was tested by the D.C. panel tester. Once D.C. testing is complete, the test results from test drivers 60 can be sent to an inker. Ink nozzles 50 are then activated to squirt a drop of ink onto the memory modules 20 on panel 25 that failed the D.C. test. The test drivers 60 can each directly or indirectly control one of the nozzles 50. Passing modules are not inked, or are marked with a different color ink, perhaps by other nozzles not shown.

In the example shown, the first, fourth, and fifth modules from the left on panel 25 have failed the D.C. test and are inked. The second, third, and sixth modules have passed the D.C. test and are not inked. After marking, links 26, 28 can be broken off of modules 20 during de-panelization.

Nozzles 50 can be a part of test heads 40, or located near test heads 40, in the D.C. tester. Then the ink can be squirted onto the failed modules immediately after the D.C. test, before panel 25 has been removed from the test position under test heads 40. Alternatively, panel 25 can be moved from the test position under test heads 40 to a separate marking position. The tested panel 25 can then be inked while another panel is moved into the test position under test heads 40 and tested. The test drivers 60 can send the test results for each module to the marker/inker, perhaps latching the results while new results are being generated for another module.

Different marking methods besides inking can be used, such as laser tagging, attaching a bar code or other sticker, or pen marking. The marking position can be a part of the D.C. test machine, or can be a separate machine. The test results could even be stored and later used to control a de-panelization machine that separates the modules, sorting the failing modules from the passing modules using the stored results. A human operator could view the results on a display screen and manually sort the failing modules. Results could be stored on a computer disk or transmitted over a local-area network from the D.C. tester.

Figure 6:
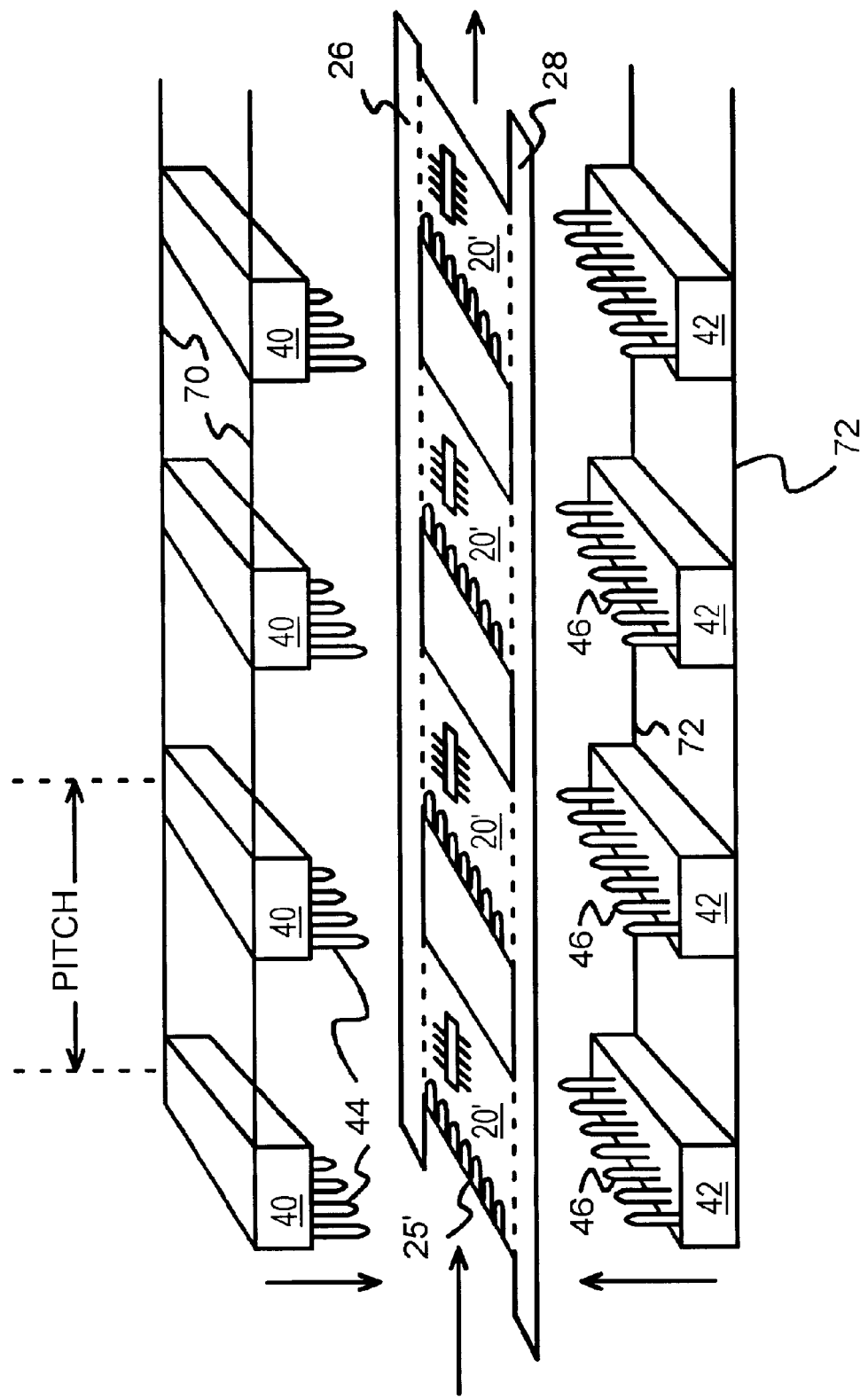
FIG. 6 shows a D.C. panel tester with a variable module pitch.

Variable Module Pitch—FIG. 6

FIG. 6 shows a D.C. panel tester with a variable module pitch. Many different kinds of memory modules can be manufactured. These different modules can have different physical dimensions. The SMT machine may have limits as to the size of the panel that can be assembled. Larger modules may reduce the number of modules per panel.

The spacing between modules on a panel is known as the pitch, as shown in FIG. 6. The D.C. tester could permanently set the spacing of test heads 40 and thus the pitch.

However, in one embodiment the D.C. tester can accommodate differing module pitches. The spacing of test heads 40, 42 can be adjusted, such as by a technician who moves test heads 40, 42 along connecting rods 70, 72 that have different settings or positions for test heads 40, 42. Thus larger modules 20' on panel 25' can be tested by the same D.C. tester.

Process Using In-Line D.C. Testing of Panels—FIG. 7

Figure 7:
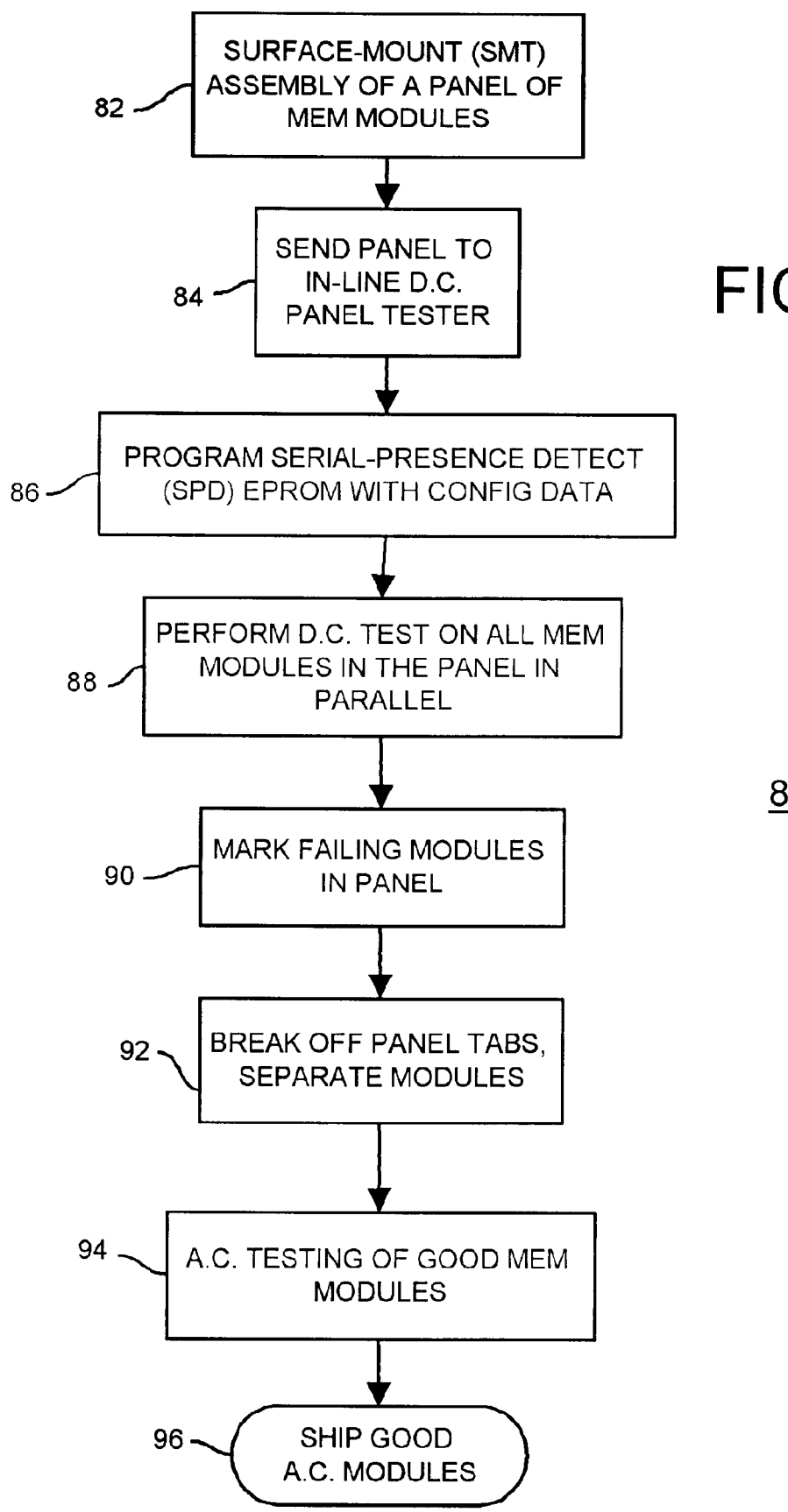
FIG. 7 is a flowchart of a manufacturing process for memory modules that uses in-line D.C. testing of modules before de-panelization.

FIG. 7 is a flowchart of a manufacturing process for memory modules that uses in-line D.C. testing of modules before de-panelization. Manufacturing process 80 uses surface-mount technology (SMT). Printed-circuit board (PCB) substrates which already have multiple layers of metal traces and the contact pads formed therein are fed into a SMT assembly machine. The SMT machine places solder paste on a surface of the PCB substrate, then places the DRAM chips on the paste. The machine heats the assembly, causing the solder paste to flow, soldering the DRAM chips to the substrate. This process can be repeated several times in the SMT machine for other components, such as capacitors and DRAM chips on the back surface.

The PCB substrates fed into the SMT machine are panel substrates with links connecting together 6 modules. The SMT machine has a conveyer system that moves the panel substrates to different stations, such as chip placement and reflow oven. Chips are inserted into all modules on a panel at the same station, so that solder reflow for all modules on the whole panel is performed in one step. Partially-built panels may be re-inserted into the SMT machine for other steps, such as back side placement and reflow. Eventually, the panel of modules is completed, step 82.

The completed panels of modules are then moved to the in-line D.C. tester, step 84. The panels can be hand-carried from the SMT machine to the D.C. tester, or the panels can be automatically transferred from the SMT machine to the D.C. tester. A stack of panels known as a buffer can be placed between the SMT machine and the D.C. tester, or a conveyer can allow the panels to cool before reaching the D.C. tester.

Once loaded onto the D.C. tester, the panel is moved into the test position and the test heads make contact with the contact pads of all modules on the panel. A serial-presence-detect (SPD) EPROM can be programmed with the module's configuration, step 86. The configuration can be input to the D.C. tester during setup, since all modules in a batch or run usually have the same configuration. The SPD programming step can occur either before the D.C. test, after the D.C. test step 88, or as part of the D.C. test. Not all modules have an SPD EPROM, and this step 86 can be skipped or performed at a different part of the process, such as on the A.C. tester.

The D.C. test is performed on all modules on the panel, step 88. Once the D.C. test is complete, the test heads are removed from the panel's modules, and failing modules are marked, step 90. Inking or other marking can be used.

The panels are then removed from the D.C. tester and moved to the de-panelization station. De-panelization is performed by breaking off the links from the D.C.-tested modules, step 92. The links are discarded and the modules are sorted, with the marked modules being discarded or sent for inspection or re-work. The un-marked modules are stacked in a tray and taken to the A.C. tester.

A.C. or functional testing of the un-marked modules is performed, step 94. A high-speed commercial tester or a motherboard-based tester can be used to perform the A.C. tests. Functional patterns write and read various patterns to the memory chips, such as checkerboard, walking-ones, and walking-zero patterns. The A.C. tester may also verify timing parameters such as access time or setup and hold times, or verify that the functional tests can be performed at a target frequency, such as the clock frequency of the motherboard. The modules that pass the A.C. tests are packaged for shipment to customers, step 96.

Since the D.C. tester operates at a lower frequency than does the A.C. tester, parasitics from long cables are not problematic with the D.C. tester as they are with the A.C. tester. Thus the D.C. tester can be a much less expensive tester than the A.C. tester.

D.C. Tester Operation—FIG. 8

Figure 8:
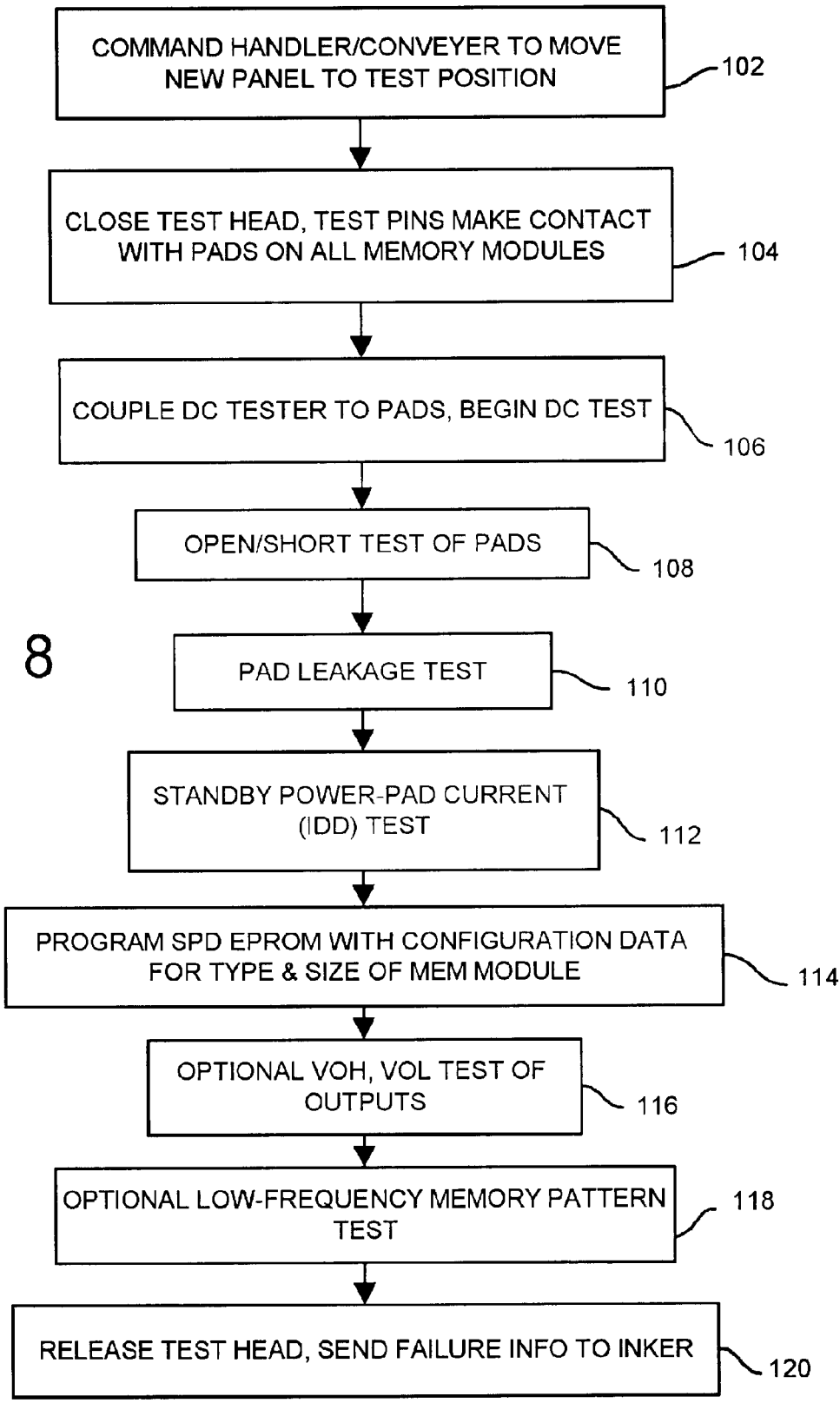
FIG. 8 is a flowchart of operation of the D.C. tester.

FIG. 8 is a flowchart of operation of the D.C. tester. Tester routine 100 is performed in the production line on each panel of modules after assembly but before de-panelization and A.C. testing.

The system controller or host commands the conveyer or robotic arm to move a new panel from the SMT assembly machine or buffer stack to the test position under the test heads, step 102. The test heads are lowered/raised until the test pins make contact with the pads on all the modules on the panel, step 104. The D.C. test drivers and sensors are connected to the module pads through the test heads, step 106. The test drivers begin executing the D.C. test routine on each of the modules.

The pads are tested for opens and shorts, step 108. A voltage is applied to each pad, and the current is measured. If the current is above a limit for that pad, a short is detected. When no current is drawn, the pad is open. Of course, some pads that are inputs draw very little current and may have to skip the open test.

Leakage from some pads is tested for, step 110. This test can be the same as the open/short test, or can have different current limits and different input conditions, such as activating a different mode on the DRAM chips. The standby power drawn through the power pad or pads is checked in step 112. This current is usually higher than the leakage on other pads, but should fall within a specified range.

The SPD EPROM is programmed in step 114. A special command sequence of signals is usually needed to activate the EPROM's programming mode, and to input the module's configuration data to the EPROM.

High and low voltage levels of the outputs can be tested, step 116. The VOH and VOL voltages are usually specified for the module under certain test conditions. The VOH and VOL voltages screened for by the D.C. tester can vary from the spec numbers, such as to add a guardband. Likewise, the input high and low logic levels can be verified, VIH, VIL.

A test pattern of several hundred, thousand, or millions of test vectors can also be applied in a low-frequency functional test, step 118. This test can be used to verify that the memory can store data. Even a simple pattern can find failures such as one data line or bit being stuck high or low. These patterns are run at a relatively slow frequency of perhaps several hundred KHz or a few MHz.

Upon completion of the D.C. tests, the test heads are raised/lowered to release the panel. The conveyer or robot is instructed to move the tested panel to the marking station. The test results are sent from the test sensors to the marking station, and the failing modules on the panel are inked or otherwise marked, step 120.

The output-level test and pattern test, steps 116, 118, are optional and can be skipped. Test engineers can decide if it is cost-effective to run these more advanced tests on the D.C. tester to screen out defective modules that otherwise pass the other D.C. tests. Other D.C. tests, such as the leakage and shorts tests, can be applied to a subset of the pads rather than to all pads. The order of the tests can also be varied.

Alternate Embodiments

Several other embodiments are contemplated by the inventors. For example the D.C. tester could be combined with a handler machine that moves or drops the panels into position. The test heads could really be sub-heads or portions of a larger test head. Pitch could be adjusted by moving sets of pins on the larger head, with each set of pins for contacting a different module. Rather than testing all modules on a panel, only one module or a subset of the modules on the panel could be tested. The entire panel could be rejected to a re-work station for further testing when even one module fails. Then inking of failed modules is not necessary. The conveyer or handler could be instructed by the tester to sort out the failed panels to a different bin.

The number of modules per panel can vary. Some panels have 6 modules, while others may have only 4. Other numbers of modules per panel are also possible and various changes to the orientation and layout of modules on the panel are possible. Links are ordinarily made from the same substrate as the modules' PCB, although metal wiring is not usually present on the links. Other kinds of links are possible, such as metal frames that hold the modules together in a panel.

In one embodiment, the panel in the D.C. tester is the same panel that was processed by the SMT machine that inserts the memory chips onto the substrate of panel, but in other embodiments the SMT and D.C. tester panel sizes could differ, such as by splitting larger SMT panels into two smaller panels for the D.C. tester, or by combining two SMT panels into a single panel for the D.C. tester. Indeed, panels could be strung together by plastic or metal clips to be pulled along together in a conveyer-belt-like manner. Rather than using solder reflow, other kinds of bonding techniques can be used during assembly, such as ultrasonic or mechanical bonding. Some SMT machines may not perform all steps, such as not applying solder paste but requiring that substrates with manually-applied solder paste be input to the SMT machine.

Many different kinds of memory chips can be included on a memory module, such as DRAM, synchronous DRAM (SDRAM), Rambus-DRAM (RDRAM), double-data-rate DRAM (DDR-DRAM), video RAM, static RAM, read-only-memory (ROM), and a wide variety of other propriety names for memories. Combination memories that are part DRAM and part static RAM or ROM can also be substituted.

Single-sided memory modules without pads on the bottom could be tested in a D.C. tester with only upper test heads, without the lower test heads. Alternatively, some double-sided modules could be tested with only the upper test heads contacting the pads on one surface of the modules. The signals on the reverse surface of the module could simply not be tested, and a subset of the total D.C. tests performed on just the top-surface pads. The pads on the module are the leadless contact pads that make electrical contact with a memory-module socket. The D.C. tester could also make contact with special test pads on the memory module that are not connected by ordinary sockets.

Of course, one of the test heads could be stationary with the panel moving to produce the relative movement, either in the up/down direction or in the conveyer direction. The D.C. tester itself could be rotated, flipped, etc. in different ways to better fit the production flow, so directions used herein are for explanatory purposes and not necessarily absolute. Assembly techniques other than surface-mount or SMT machines could be used.

The D.C. test can be performed in a partially-parallel or even a serial fashion. For example, the test heads could have a pitch of two modules rather than one module. Once the panel is moved under the test heads, the test heads are lowered and make contact with pads on only half of the modules on the panel, such as the odd-numbered modules (1, 3, 5). The D.C. tests are performed on these three modules. Once completed, the test heads are raised and re-positioned over the other (even-numbered . . . 2, 4, 6) modules on the same panel. The test heads are lowered again and D.C. testing performed on the even-numbered modules. Once complete, the test heads are again raised and the panel moved on to be marked. Serial testing could also be performed where a single set of upper and lower test heads is used to test all modules on the panel, one at a time. Of course, better throughput is achieved with a more parallel operation.

The abstract of the disclosure is provided to comply with the rules requiring an abstract which will allow a searcher to quickly ascertain the subject matter of the technical disclosure of any patent issued from this disclosure. It is submitted with the understanding that it will not be used to interpret or limit the scope or meaning of the claims. 37 C.F.R. Sect. 1.72(b). Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A parallel tester for testing a panel of memory modules comprising:

a plurality of upper test heads, each upper test head having pad contactors for making electrical contact with metal pads on one of the memory modules on the panel of memory modules;

a plurality of lower test heads, each lower test head having pad contactors for making electrical contact with metal pads on the memory module on the panel of memory modules;

a plurality of test drivers for applying test signals to the upper and lower test heads, the test signals for applying test conditions to the memory modules through the pad contactors and the metal pads, each test driver sensing current or voltage conditions on at least one of the metal pads and comparing the current or voltage conditions to predetermined conditions to determine when the memory module has failed; and a positioner that handles the panel and moves the panel into a test position between the upper and lower test heads and removes the panel from the test position after testing by the test driver;

wherein the upper test heads are lowered relative to the panel in the test position, and the lower test heads are raised relative to the panel in the test position, to make contact with the metal pads on upper and lower surfaces of a plurality of the memory modules on the panel;

wherein the plurality of memory modules on the panel are tested in parallel.

2. The parallel tester of claim 1 wherein the plurality of upper test heads comprises one test head and set of pad contactors for each memory module on the panel;

wherein the plurality of lower test heads comprises one test head and set of pad contactors for each memory module on the panel;

wherein the plurality of test drivers comprises one test driver for each memory module on the panel, whereby all memory modules on the panel are tested in parallel.

3. The parallel tester of claim 2 further comprising:

a marker, responsive to the plurality of test drivers, for marking memory modules on the panel that the plurality of test drivers have indicated as failures, whereby failing memory modules are marked.

4. The parallel tester of claim 3 wherein the marker is an inker that applies a drop of ink to failing memory modules on a panel to mark failing memory modules.

5. The parallel tester of claim 1 wherein the panel further comprises panel links that link the memory modules together as a single panel;

wherein the positioner handles the panel by panel links;

wherein the pad contactors do not contact the panel on the panel links.

6. The parallel tester of claim 5 wherein the positioner comprises a conveyer system that holds the panel by the panel links, a robotic arm that grips the panel by the panel links, or a handler that guides the panel by the panel links.

7. The parallel tester of claim 6 wherein the test signals from the plurality of test drivers activate memory chips mounted on the memory modules, whereby the memory chips on the memory modules are tested.

8. The parallel tester of claim 7 wherein the pad contactors comprise pins, metal bumps, or spring-loaded pins.

9. A panel tester comprising:

first means for making electrical contact with contact pads on a first surface of a memory module that is part of a panel of a plurality of memory modules before separation;

second means for making electrical contact with contact pads on a second surface of the memory module that is part of the panel of memory modules before separation;

placement means for moving the panel into a test position where the first means and the second means can both make electrical contact with the contact pads of the memory module;

test driver means, coupled to the first and second means, for driving test signals to the contact pads and for sensing test conditions from the contact pads and detecting a failure of the memory module; and indicating means, coupled to the test driver means, for indicating when the memory module has failed, whereby the memory module that is part of the panel of the plurality of memory modules before separation is tested before separation from the panel.

10. The panel tester of claim 9 wherein the first means includes a plurality of first head means, each first head means for making electrical contact with contact pads on the first surface of a different one of the plurality of memory modules on the panel;

wherein the second means includes a plurality of second head means, each second head means for making electrical contact with contact pads on the second surface of a different one of the plurality of memory modules on the panel;

wherein the test driver means drives the test signals to the plurality of first and second head means to test several of the memory modules on the panel;

wherein the indicating means indicates which of the plurality of memory modules has failed, whereby several memory modules on the panel are tested simultaneously.

11. The panel tester of claim 10 wherein the indicating means marks memory modules on the panel that have failed, but does not mark memory modules on the panel that have not failed.

12. The panel tester of claim 9 further comprising:

first pitch means, coupled to the plurality of first head means, for setting a pitch of the plurality of first head means to match a pitch between contact pads from one memory module to another memory module on the panel;

second pitch means, coupled to the plurality of second head means, for setting a pitch of the plurality of second head means to match the pitch between contact pads from one memory module to another memory module on the panel, whereby panels having different spacing of memory modules can be tested by adjusting the panel tester.

* * * * *